(12) United States Patent
Yang et al.

(10) Patent No.: US 7,626,854 B1
(45) Date of Patent: Dec. 1, 2009

(54) 2-WRITE 3-READ SRAM DESIGN USING A 12-T STORAGE CELL

(75) Inventors: Ge Yang, Pleasanton, CA (US); Hwong-Kwo (Hank) Lin, Palo Alto, CA (US); Charles Chew-Yuen Young, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 83 days.

(21) Appl. No.: 11/952,087

(22) Filed: Dec. 6, 2007

Related U.S. Application Data

(60) Provisional application No. 60/954,958, filed on Aug. 9, 2007.

(51) Int. Cl.
*G11C 11/00* (2006.01)
(52) U.S. Cl. .................... 365/154; 365/256; 365/230.05
(58) Field of Classification Search .................. 365/154, 365/156, 230.05
See application file for complete search history.

(56) References Cited

U.S. PATENT DOCUMENTS

| | | | | |
|---|---|---|---|---|
| 5,742,557 A | * | 4/1998 | Gibbins et al. | 365/230.05 |
| 7,304,352 B2 | * | 12/2007 | Muller et al. | 257/369 |
| 7,440,356 B2 | * | 10/2008 | Venkatraman et al. | 365/230.05 |
| 2008/0155362 A1 | * | 6/2008 | Chang et al. | 714/718 |
| 2009/0016138 A1 | * | 1/2009 | Bhatia | 365/226 |

* cited by examiner

*Primary Examiner*—Gene N. Auduong
(74) *Attorney, Agent, or Firm*—Patterson & Sheridan, LLP

(57) ABSTRACT

One embodiment of the present invention sets forth a twelve transistor static random access memory storage cell that provides two write ports and three read ports. The write word line operates at twice the clock frequency. The write bit lines are differential to provide high-performance writes. Each read word line operates at the clock frequency. Single-ended read bit lines are used to provide read performance comparable to write performance. The resulting storage cell only requires four horizontal word lines and five vertical bit lines, enabling very dense, yet high-performance designs.

21 Claims, 14 Drawing Sheets

2-WRITE 3-READ SRAM DESIGN USING A 12-T STORAGE CELL

CROSS-REFERENCE TO RELATED APPLICATIONS

This application claims benefit of U.S. provisional patent application Ser. No. 60/954,958, filed Aug. 9, 2007, which is herein incorporated by reference.

BACKGROUND OF THE INVENTION

1. Field of the Invention

Embodiments of the present invention relate generally to integrated circuit memory and more specifically to a 2-Write 3-Read SRAM design using a 12-T storage cell.

2. Description of the Related Art

Integrated circuits frequently employ certain common system building block circuits, such as logic gates and memory blocks to construct the overall system functionality of a given integrated circuit. Each type of system building block circuit is typically optimized to perform a specific function and further optimized for a given criteria, such as operating speed, power consumption, or die area. Furthermore, architecturally distinct designs may be selected to meet a specific design or optimization criteria. For example, a system design may require a static random access memory (SRAM) with two write ports (2-write) and three read ports (3-read).

A conventional SRAM designed to provide two write ports and three read ports typically includes five independent address decoders and extends a conventional six-transistor (6-T) SRAM cell to include fourteen transistors, two write ports and three read ports. Each read port and write port that is added to the 6-T SRAM cell requires a separate word line and two bit lines. The resulting SRAM cell includes fourteen transistors, as well as five horizontal word lines, and ten vertical bit lines. This configuration typically requires more die area for the word lines and bit lines used to connect SRAM cells than the actual transistors used to compose the SRAM cells, resulting in relatively low die area utilization within the SRAM circuit. Low die area utilization within this SRAM circuit (referred to as a 2-write 3-read SRAM) results in increased overall die area. However, minimizing die area is an important requirement because die area directly impacts the cost of manufacturing a given integrated circuit.

One approach to decreasing the die area associated with an SRAM circuit is to use an SRAM circuit with fewer ports and multiplex access to the ports. However, multiplexing access to an SRAM circuit may not meet certain performance requirements and is not a suitable solution in many cases.

As the foregoing illustrates, what is needed in the art is a 2-write 3-read SRAM circuit that is die area efficient and provides high-performance.

SUMMARY OF THE INVENTION

One embodiment of the present invention sets forth a static random access memory (SRAM) storage cell. The SRAM storage cell includes a first inverter and a second inverter configured to provide a cross-coupled latch, a first N-channel field-effect transistor (NFET) and a second NFET configured to provide write access to the cross-coupled latch, a third NFET and a fourth NFET configured to provide an inverted single-ended read access to the cross-coupled latch, and a fifth NFET and a sixth NFET configured to provide a non-inverted single-ended read access to the cross-coupled latch.

One advantage of the disclosed SRAM storage cell is that the write word line operates at twice the clock frequency, and the write bit lines are differential to provide high-performance writes. Each read word line operates at the clock frequency, and single-ended read bit lines are used to provide read performance comparable to write performance. The resulting storage cell only requires four horizontal word lines and five vertical bit lines, thereby enabling very dense, yet high-performance designs.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
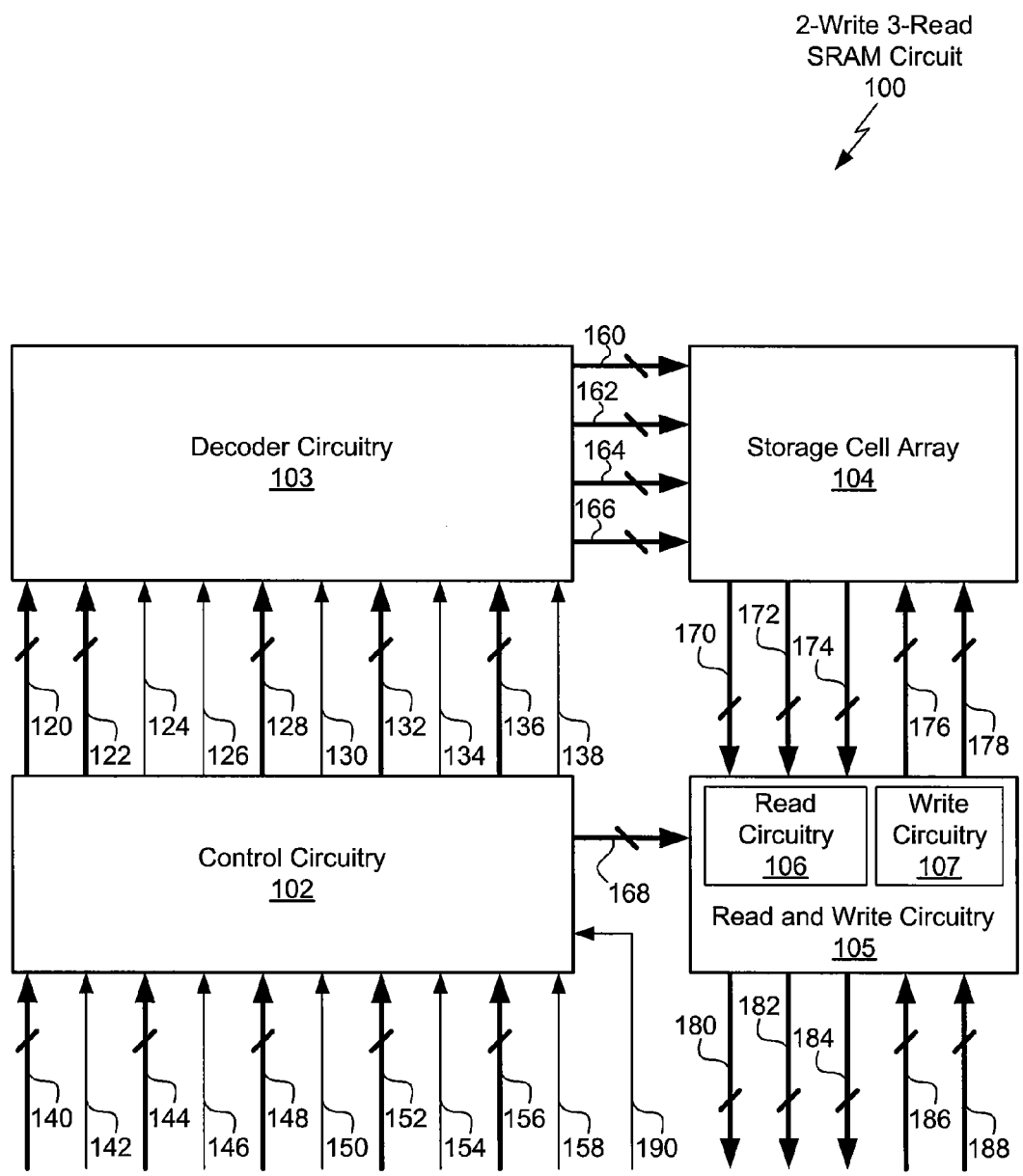
FIG. 1 illustrates the architecture of a two write, three read static random access (SRAM) memory circuit, according to one embodiment of the invention.

FIG. 1 illustrates the architecture of a two write (2-write), three read (3-read) static random access (SRAM) memory circuit 100, according to one embodiment of the invention. The 2-write 3-read SRAM circuit 100 includes control circuitry 102, decoder circuitry 103, a storage cell array 104, and read and write circuitry 105.

The control circuitry 102 includes two input write addresses, write address zero (W0A) 140 and write address one (W1A) 144, with corresponding write enables write enable zero (W0E) 142 and write enable one (W1E) 146. The control circuitry 102 also includes three input read addresses, read address zero (R0A) 148, read address one (R1A) 152 and read address two (R2A) 156, with corresponding read enables read enable zero (R0E) 150, read enable one (R1E) 154, and read enable two (R2E) 158. A clock input (CLK) 190 controls the timing of read and write operations within the SRAM circuit 100. When W0E 142 is active, then W0A 140 serves as the address for a write operation from write port zero. When W1E 146 is active, then W1A 144 serves as the address for a write operation from write port one.

The control circuitry 102 generates two write address signals, write address 0 (w0adr) 120 and write address 1 (w1adr) 122, a write select (wsel) 124, and a write word line clock (wwlclk) 126. The w0adr 120 signal is generated from a subset of address bits taken from W0A 140. Similarly, the w1adr 122 signal is generated from a subset of address bits taken from W1A 144. In one embodiment, write addresses 120 and 122 represent the upper N−1 address bits of W0A 140 and W1A 144, respectively, where N is the number of address bits in each address W0A 140 and W1A 144. Each write address 120, 122 may be stored at a positive edge of CLK 190 in flip-flops within the control circuitry 102. As described below, the wsel 124 and wwlclk 126 signals are used within the decoder circuitry 103 to generate word line timing pulses.

The control circuitry 102 generates three read address signals, read address 0 (r0adr) 128, read address 1 (r1adr) 132, read address 2 (r2adr) 136, and three word line read clocks r0wlclk 130, r1wlclk 134, and r2wlclk 138. The r0adr 128 signal is generated from a subset of address bits taken from R0A 148. The r1adr 132 signal is generated from a subset of address bits taken from R1A 152. The r2adr 136 signal is generated from a subset of address bits taken from R2A 156. In one embodiment, read addresses 128, 132 and 136 represent the upper N−1 address bits of R0A 148, R1A 152 and R2A 156, respectively, where N is the number of address bits in each address R0A 148, R1A 152, and R2A 156. Each read address 128, 132, 136 may be stored at a positive edge of CLK 190 in flip-flops within the control circuitry 102.

The control circuitry 102 generates control signals 168 for controlling the read and write circuitry 105. The control signals 168 include, for example, timing pulses used to precharge, initiate a read, and initiate a write operation. The control signals 168 may also include selector bits, typically derived from address bits associated with write addresses 140, 144, and read addresses 148, 152, 156. In one embodiment, one or more least significant address bits from each address 140, 144, 148, 152, 156 is used as a selector bit within control signals 168.

The decoder circuitry 103 decodes read addresses 128, 132, 136, whereby one unique read word line may be enabled for each code available within each of the three read addresses 128, 132, 136. For example, if read addresses 128, 132, 136 each include eight bits, then a possible 2^8 (or 256) read word lines may be decoded by decoder circuitry 103 per read address 128, 132, 136. Read word line clocks r0wlclk 130, r1wlclk 134, r2wlclk 138 may be used to provide gating or further decoding, as required by the specific implementation. For example, r0wlclk 130 may be used to gate the read word line decoded from r0adr 128. Similarly, r1wlclk 134 may be used to gate the read word line decoded from r1adr 132, and r2wlclk 138 may be used to gate the read word line decoded from r2adr 136. Read word lines 162 are generated from r0adr 128 and r0wlclk 130. Read word lines 164 are generated from r1adr 132 and r1wlclk 134. Read word lines 166 are generated from r2adr 136 and r2wlclk 138.

The decoder circuitry 103 also decodes write addresses 120, 122, whereby one unique write word line may be enabled for each code available within each of the two write addresses 120, 122 and where each address effects a write word line pulse corresponding to a half clock cycle, effectively providing two write operations per clock cycle of CLK 190. Write word lines 160 are generated from write addresses w0adr 120 and w1adr 122, along with wsel 124 and wwlclk 126.

The storage cell array 104 includes an array of at least one storage cell used to store data. Data is written to the storage cell when an associated word line within write word lines 160 selects the row containing the storage cell and write bit lines wbl 176 and wblb 178 are driven by write circuitry 107. Each bit line within the write bit lines wbl 176 includes a complementary write bit line within bit lines wblb 178. An entire row is typically selected by a write word line within write word lines 160 by per half clock cycle, and one or more bits within the row may be written by a write operation.

Data is read from the storage cell when an active read word line within read word lines 162, 164 or 166 selects a row that includes the storage cell to be read. The data from the storage cell is transmitted along read bit lines associated with the active read word line. An entire row is typically selected by a word line, and one or more bits may be read by read circuitry 106 during a read operation.

The read and write circuitry 105 is coupled to write bit lines wbl 176 and wblb 178, which are used for writing data to the storage cell array 104, and read bit lines 170, 172, 174, used for writing data within the storage cell array 104. The read circuitry 106 reads data on bit lines 170, 172, 174 and drives the read data to outputs RD0 180, RD1 182, and RD2 184, respectively. The write circuitry 107 receives data on inputs W0D 186 and W1D 188 and drives the data on write bit lines wbl 176 and wblb 178, based on the operation of control bits 168, which control write operations.

Figure 2A:
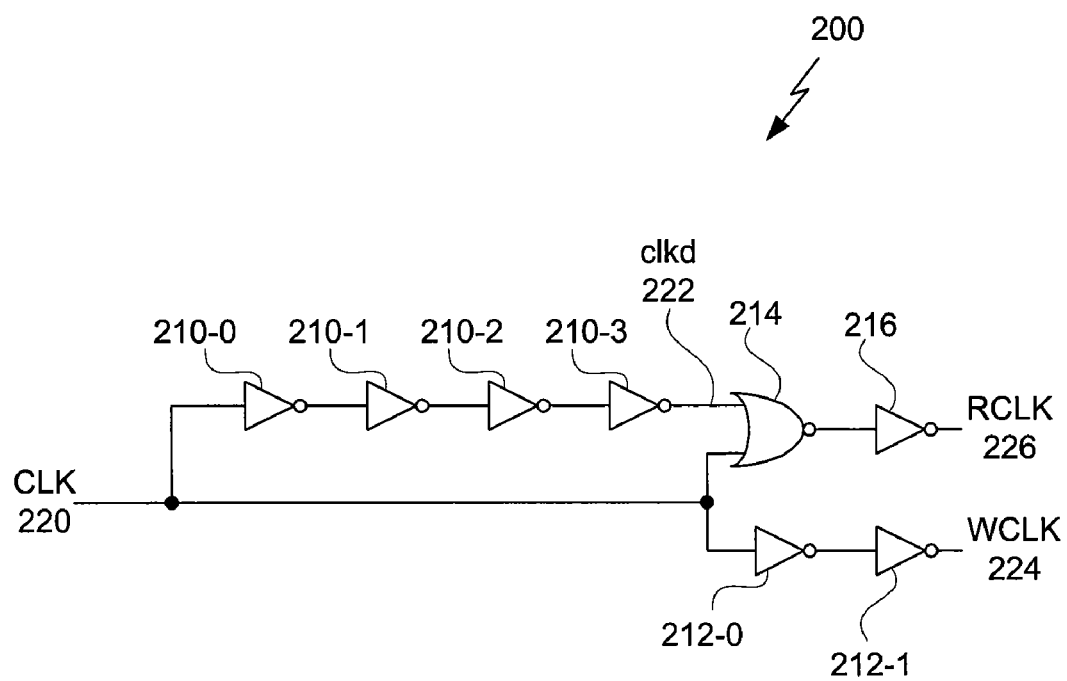
FIG. 2A illustrates a read clock and write clock generator circuit, according to one embodiment of the invention.

FIG. 2A illustrates a read clock (RCLK) 226 and write clock (WCLK) 224 generator circuit, according to one embodiment of the invention. A clock (CLK) 220 input receives a system clock signal, which is buffered by inverters 212 to produce the WCLK 224 signal. Inverters 210 generate a delayed clock (clkd) 222 from CLK 220. The two clock signals, CLK 220 and clkd 222, are combined and buffered NOR-gate 214 and inverter 216 so generate RCLK 226. Importantly, the RCLK 226 modifies the original CLK 220 signal to extend the high time of the clock signal by the combined delay of inverters 210.

Figure 2B:
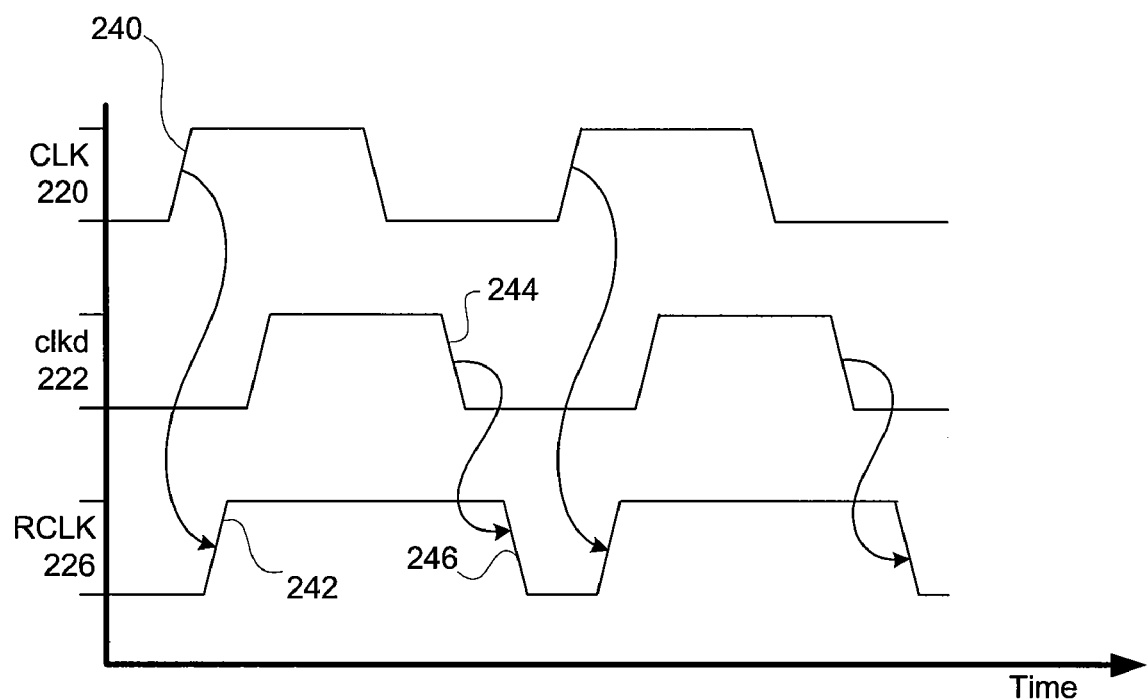
FIG. 2B illustrates the clock generation process for the read clock using signal waveforms, according to one embodiment of the invention.

FIG. 2B illustrates the clock generation process for the read clock using signal waveforms, according to one embodiment of the invention. The input CLK 220 is delayed to produce clkd 222, which extends the high portion of the read clock signal RCLK 226. As show, rising edge 240 on CLK 220 produces rising edge 242 in RCLK 226. However, the falling edge 246 of RCLK 226 is produced by the delayed falling edge 244 of clkd 222.

Figure 3:
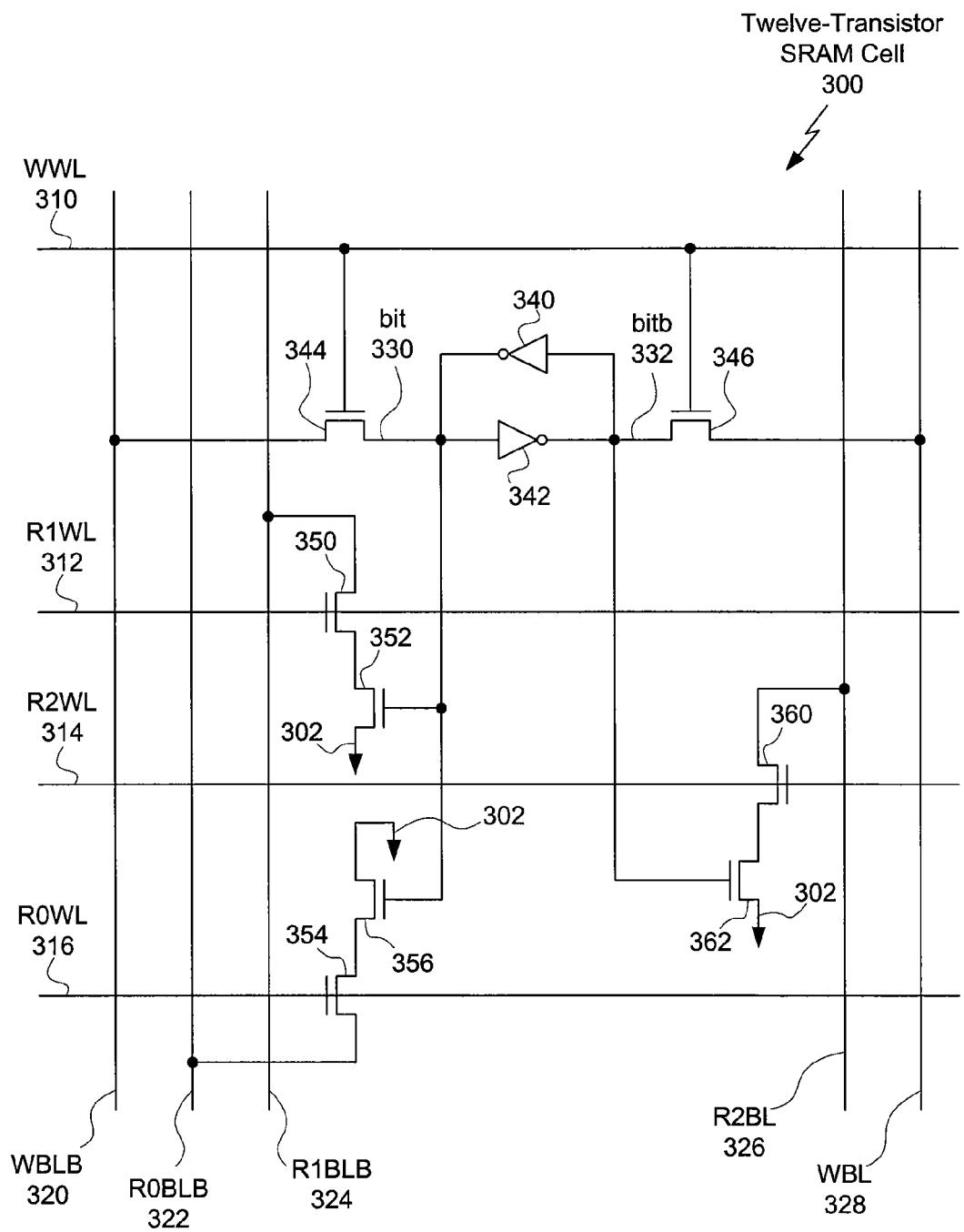
FIG. 3 illustrates a twelve-transistor static random access memory storage cell, according to one embodiment of the invention.

FIG. 3 illustrates a twelve-transistor (12-T) static random access memory (SRAM) storage cell 300, according to one embodiment of the invention. The 12-T SRAM storage cell 300 includes eight n-channel field-effect transistors (N-FETs) 344, 346, 350, 352, 354, 356, 360, 362, and two inverters 340, 342, each conventionally constructed using one N-FET and one p-channel field-effect transistor (P-FET). The 12-T SRAM storage cell 300 includes one write word line (WWL) 310, and three read word lines R0WL 316, R1WL 312, and R2WL 314. The 12-T SRAM storage cell 300 also includes two write bit lines, WBL 328 and a corresponding complement WBLB 320, forming a pair of differential write bit lines. Furthermore, the 12-T SRAM storage cell 300 includes three single-ended read bit lines R0BLB 322, R1BLB 324, and R2BL 326. Bit lines R0BLB 322, R1BLB 324 provide inverted representations of stored data within the 12-T SRAM storage cell 300, indicated by the trailing "B" in the signal name, while bit line R2BL 326 provides a non-inverted representation of the stored data.

Inverters 340 and 342 form a cross-coupled latch for storing one bit of data. The one bit of data is stored in an inverted representation on node bitb 332 and a non-inverted representation on node bit 330. When WWL 310 is high (active), N-FETs 344 and 346 couple WBLB 320 to bit 330 and WBL 328 to bitb 332, respectively, allowing the write circuitry 107 of FIG. 1 to force the cross-coupled latch into a new state, thereby writing one bit of data into the cross-coupled latch.

When R0WL 316 is high, N-FET 354 is turned on, enabling a portion of a path from R0BLB 322 to ground 302. When bit 330 is high, N-FET 356 is also turned on, completing the path from R0BLB 322 to ground 302. In other words, when bit 330 is high and R0WL 316 is high, R0BLB 322 is pulled to ground through N-FETs 354 and 356, presenting an inverted representation of high data stored within the cross-coupled latch to read circuitry 106. When R0WL 316 is high, but bit 330 is low, R0BLB 322 is left in a high pre-charge state, which read circuitry 106 reads as a high (inverted) value for the low data stored in the cross-coupled latch.

Similarly, when R1WL 312 is high, N-FET 350 is turned on, enabling a portion of a path from R1BLB 324 to ground 302. When bit 330 is high, N-FET 352 is also turned on, completing the path from R1BLB 324 to ground 302. In other words, when bit 330 is high and R1WL 312 is high, R1BLB 324 is pulled to ground through N-FETs 350 and 352, presenting an inverted representation of high data stored within the cross-coupled latch to read circuitry 106. When R1WL 312 is high, but bit 330 is low, R1BLB 324 is left in a high pre-charge state, which read circuitry 106 reads as a high (inverted) value for the low data stored in the cross-coupled latch.

When R2WL 314 is high, N-FET 360 is turned on, enabling a portion of a path from R2BL 326 to ground 302. When 332 bitb is high (bit 330 is low), N-FET 362 is also turned on, completing the path from R2BL 326 to ground 302. In other words, when bitb 332 is high (bit 330 is low) and R2WL 314 is high, R2BL 326 is pulled to ground through N-FETs 360 and 362, presenting a non-inverted representation of low data stored within the cross-coupled latch to read circuitry 106. When R2WL 314 is high, but bitb 332 is low (bit 330 is high), R2BL 326 is left in a high pre-charge state, which read circuitry 106 reads as a high value (non-inverted) for the high data stored in the cross-coupled latch.

Figure 4A:
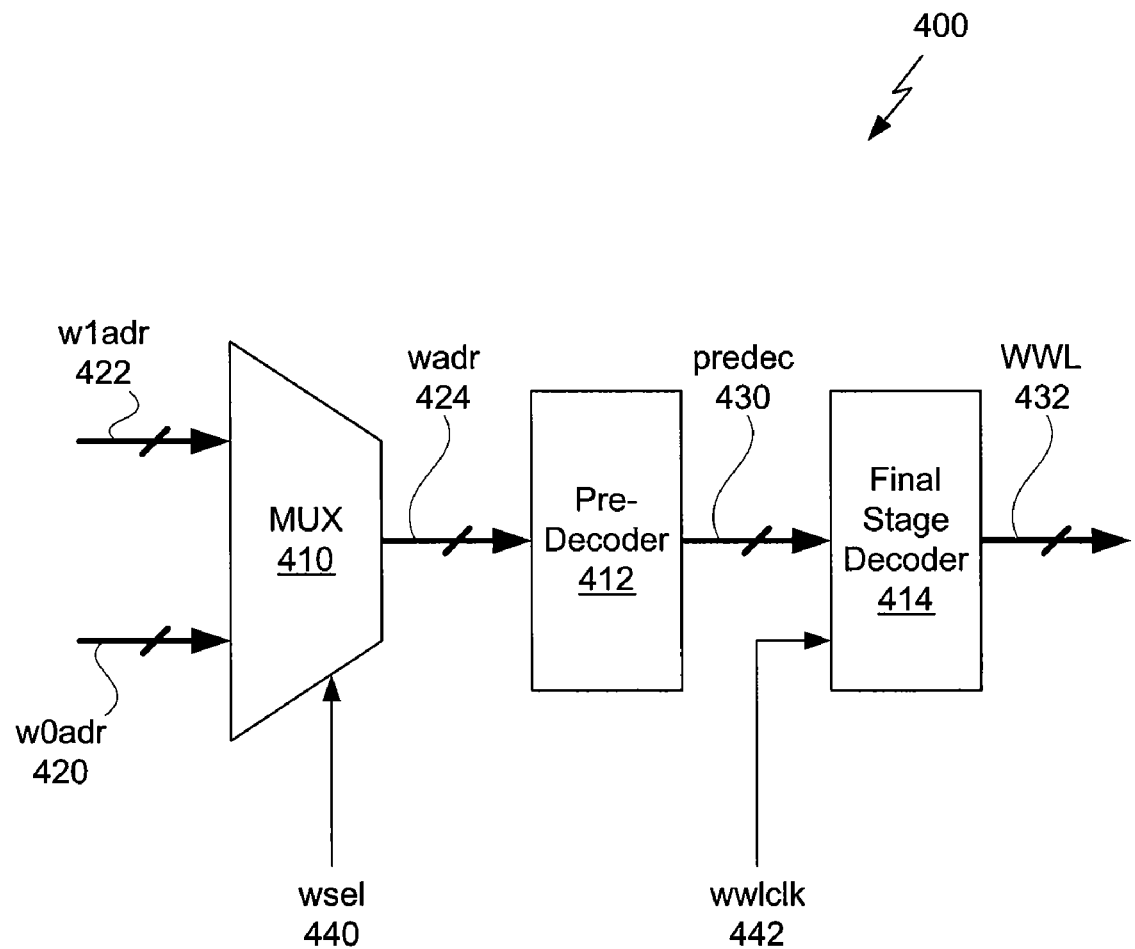
FIG. 4A illustrates a write decoder for the SRAM circuit, according to one embodiment of the invention.

FIG. 4A illustrates a write decoder 400 for the SRAM circuit 100, according to one embodiment of the invention. A multiplexer (MUX) 410 receives a first write address w0adr 420, a second write address w1adr 422, and a select input, wsel 440. When wsel 440 is low, the MUX 410 transmits w0adr 420 to output wadr 424. Otherwise, when wsel 440 is high, the MUX 410 transmits w1adr 422 to output wadr 424. MUX 410 performs a conventional multipexer function, with the number of bits in each of w0adr 420 and w1adr 422 equal to the number of bits in wadr 424.

The pre-decoder 412 decodes wadr 424 into a pre-decoded value, predec 430. For example, if wadr 424 includes eight bits, then predec 430 includes two by two raised to the fourth power bits (thirty-two total bits), which go to the final stage decoder 414.

The final stage decoder 414 combines the predec 430 signal and a write word line clock (wwlclk) 442 to produce a set of write word lines (WWL) 432. By alternating wsel 440 in conjunction with wwlclk 442, WWL 432 may produce two write pulses per system clock period, enabling two write operations per system clock cycle.

Figure 4B:
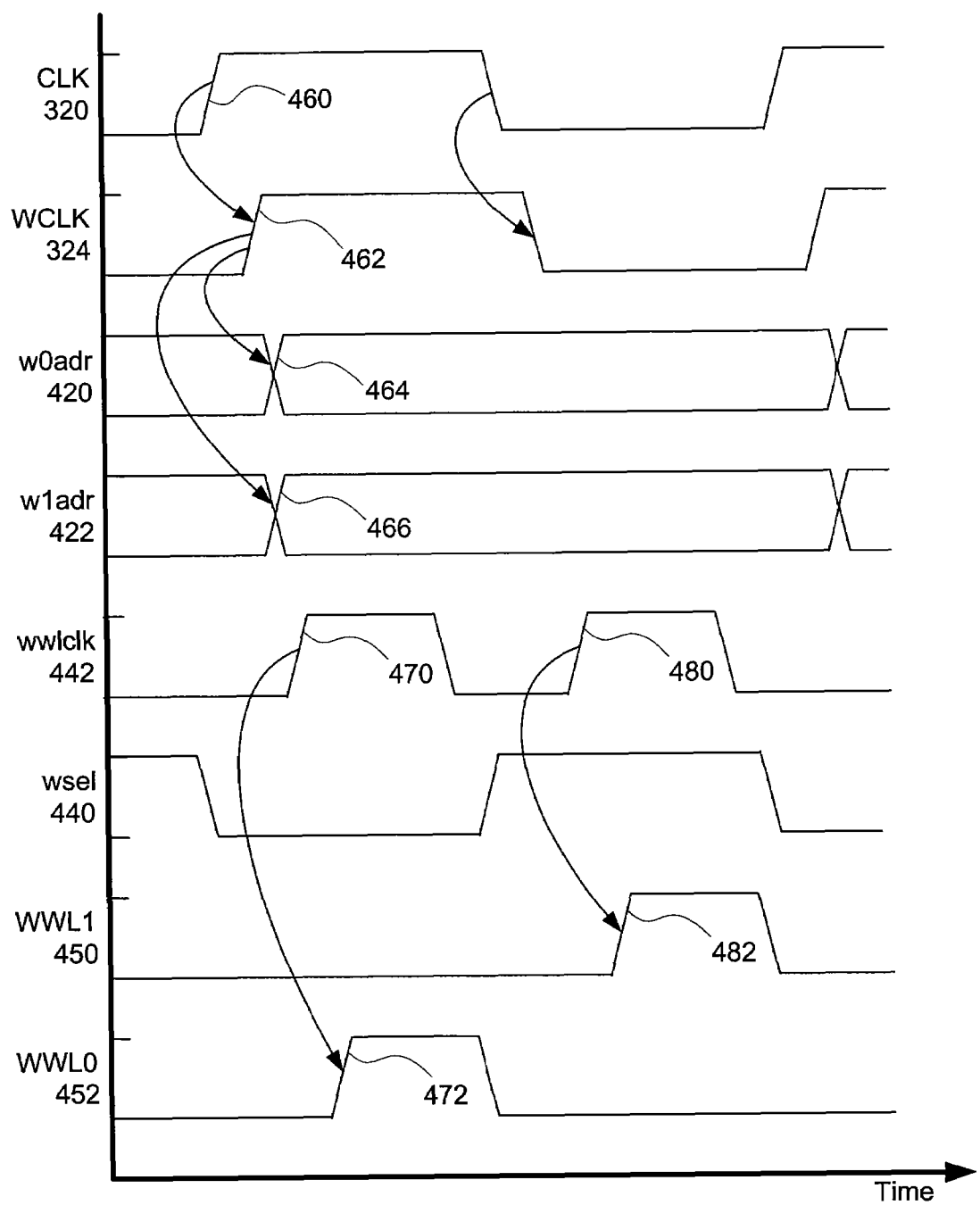
FIG. 4B illustrates the operation of the write decoder using signal waveforms, according to one embodiment of the invention.

FIG. 4B illustrates the operation of the write decoder 400 using signal waveforms, according to one embodiment of the invention. System clock (CLK) 320 providers overall timing for the operation of the write decoder 400. Rising edge 460 on CLK 320 triggers rising edge 462 in WCLK 324. Rising edge 462 triggers two independent write addresses to be captured and stored in flip-flops as w0adr 420 and w1adr 422, which correspond to w0adr 120 and w1adr 122 of FIG. 1, respectively. This is represented by transitions 464 and 466 in w0adr 420 and w1adr 422, respectively.

Two pulses are generated on wwlclk 442, which corresponds to wwlclk 126. The first pulse on wwlclk 442 is generated during the portion of the clock cycle when wsel 440 is selecting w0adr 420 for output from MUX 410. Rising edge 470 causes rising edge 472 in WWL0 452. WWL0 452 is the write word line within write word lines 160 that corresponds to the decoded address w0adr 420. Similarly, Rising edge 480 causes rising edge 482 in WWL1 450. WWL1 450 is the write word line within write word lines 160 that corresponds to the decoded address w1adr 422.

Figure 5A:
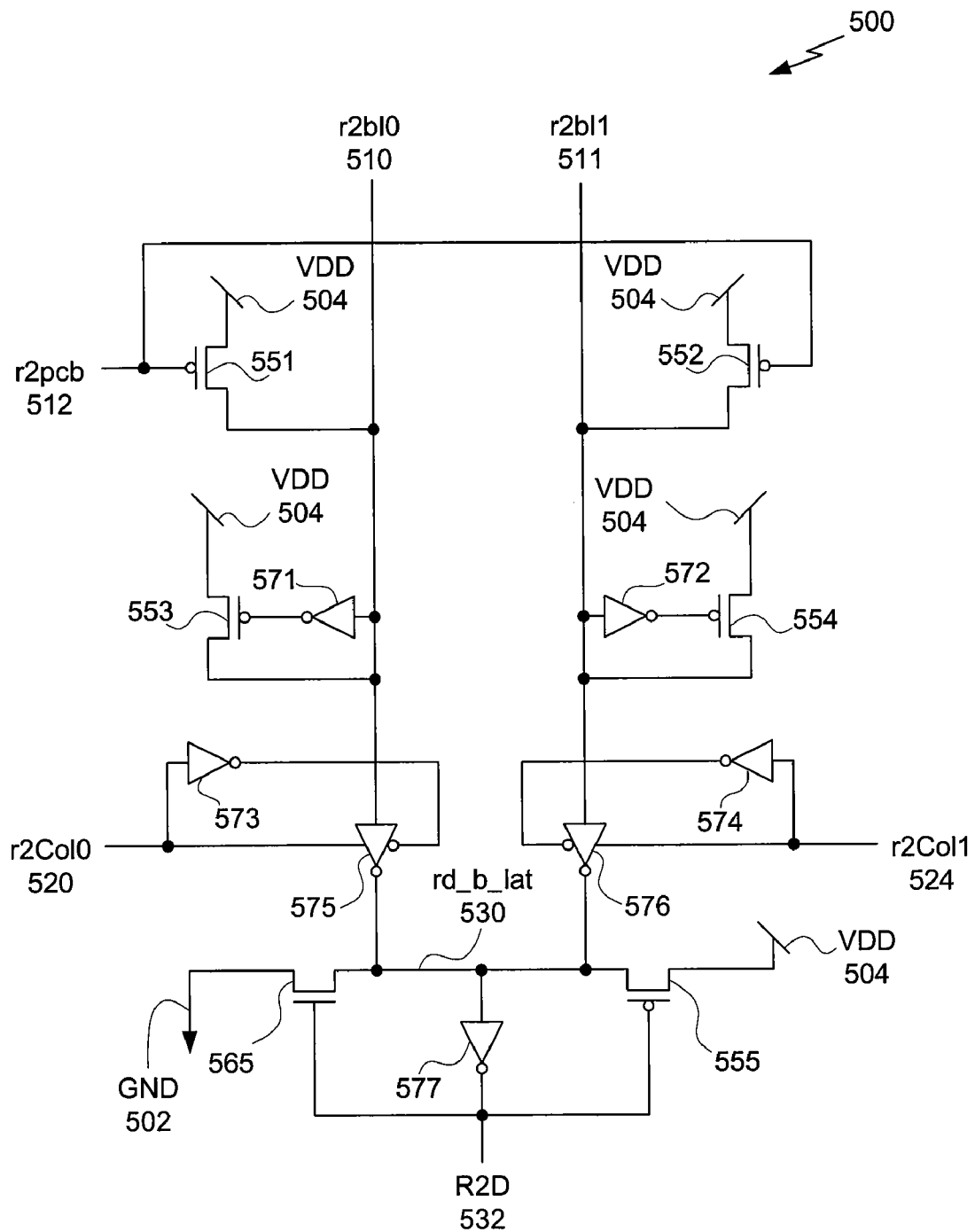
FIG. 5A illustrates a first read circuit, according to one embodiment of the invention.

FIG. 5A illustrates a first read circuit 500, according to one embodiment of the invention. The read circuit 500 includes a pre-charge pull-up circuit, a bit-keeper circuit, a column select circuit, and an output latch. The read circuit 500 includes two bit line inputs, r2bl0 510 and r2bl1 511, three control inputs, r2pcb 512, r2Col0 520, and r2Col1 524. The read circuit 500 includes output R2D 532, which drives a non-inverted representation of data latched from either r2bl0 510 or r2bl1 511. Two instances of storage cell 300, of FIG. 3, may be connected to one instance of the read circuit 500, wherein the R2BL 326 signal from the first instance of the storage cell 300 is coupled to r2bl0, and the R2BL 326 signal from the second instance of the storage cell 300 is coupled to r2bl1 511.

The pre-charge pull-up circuit includes P-FETs 551 and 552. When control input r2pcb 512 is low, P-FET 551 is turned on and provides a path from r2bl0 510 to the supply voltage (VDD) 504. When control input r2pcb 512 is low, P-FET 552 is also turned on and provides a path from r2bl1 to VDD 504. The pre-charge circuit may be used to pre-charge bit line inputs r2bl0 510 and r2bl1 511.

The bit-keeper circuit includes P-FETs 553 and 554, and inverters 571 and 572. When r2bl0 510 is in a high state, such as during a pre-charge event, the bit keeper pulls r2bl0 510 to VDD 504 through P-FET 553. Similarly, when r2bl1 511 is high, the bit-keeper circuit pulls r2bl1 511 to VDD 504 through P-FET 554. However, if r2bl0 510 is in a low state then P-FET 553 is turned off, and does not provide a pull-up from r2bl0 510 to VDD. Additionally, if r2bl1 511 is in a low state, then P-FET 554 is turned off, and does not provide a pull-up from r2bl1 511 to VDD.

Bit line r2bl0 510 may be pulled low when the first instance of storage cell 300 drives a low value onto the corresponding bit line R2BL 326. Similarly, bit line r2bl1 511 may be pulled low when the second instance of storage cell 300 drives a low value onto the corresponding bit line R2BL 326.

The column select circuit includes inverters 573 and 574, as well as gated inverters 575 and 576. When r2Col0 520 is driven high, gated inverter 575 drives node rd_b_lat 530 with an inverted representation of the value on r2bl0 510. When r2Col0 520 is driven low, gated inverter 575 presents a high-impedance (floating) output. Similarly, when r2Col1 524 is driven high, gated inverter 574 drives node rd_b_lat 530 with an inverted representation of the value on r2bl1 511. When r2Col1 521 is driven low, gated inverter 576 presents a high-impedance (floating) output. While r2Col0 520 and r2Col1 524 may be low simultaneously, they should not be high (active) simultaneously.

The output latch includes N-FET 565 and P-FET 555, as well as inverter 577. The value on node rd_b_lat 530 is inverted through inverter 577, which drives output R2D 532 with an inverted representation of the value on node rd_b_lat 530. P-FET 555 and N-FET 565 form an inverter that drives an inverted representation of the value on R2D 532 back to node rd_b_lat 53. A cross-coupled latch, which can hold read data, is formed by the combination of N-FET 565, P-FET 555, and inverter 577. Either gated inverter 575 or 576 may override the value on rd_b_lat 530 during a read operation when either r2Col0 520 or r2Col1 524 is high.

Figure 5B:
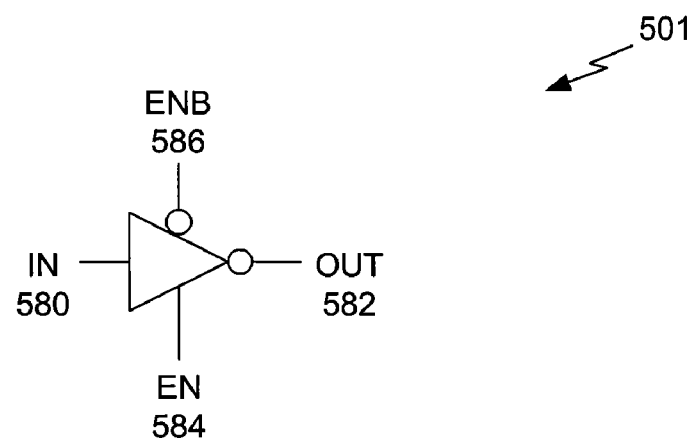
FIGS. 5B and 5C illustrate a gated inverter used within the first read circuit, according to one embodiment of the invention.
Figure 5C:
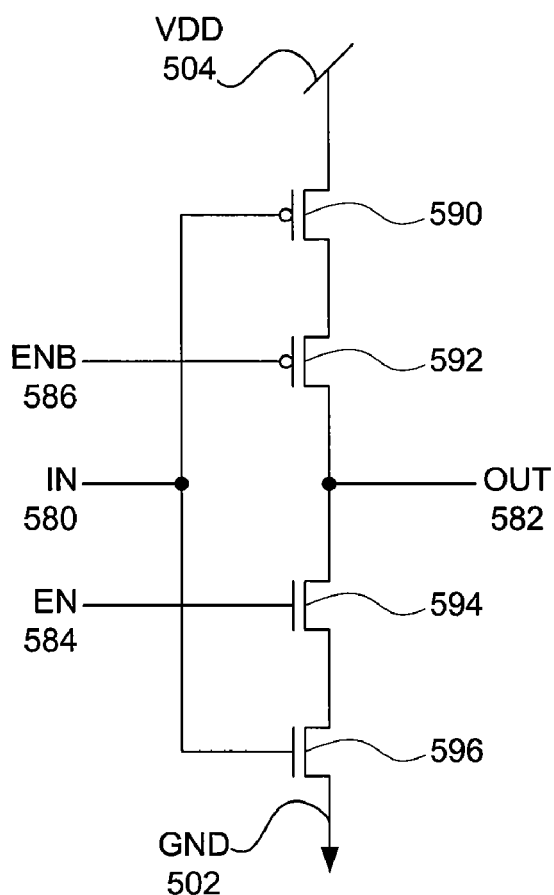

FIGS. 5B and 5C illustrate a gated inverter 501 used within the first read circuit 500, according to one embodiment of the invention. A data input (IN) 580 and two enable inputs EN 584, ENB 586 are combined to generate an output signal (OUT) 582. When EN 584 is high and ENB 586 is low, an inverted representation of IN 580 is driven to OUT 582. When EN 584 is low and ENB 586 is high, the OUT 582 is in a high-impedance (open or floating) state.

The gated inverter 501 includes P-FETs 590 and 592, which form a pull-up path from OUT 582 to VDD 504 when ENB 586 and IN 580 are both low. The gated inverter 501 also includes N-FETs 594 and 596, which form a pull-down path from OUT 582 to GND 502 when EN 584 and IN 580 are both high.

Figure 6A:
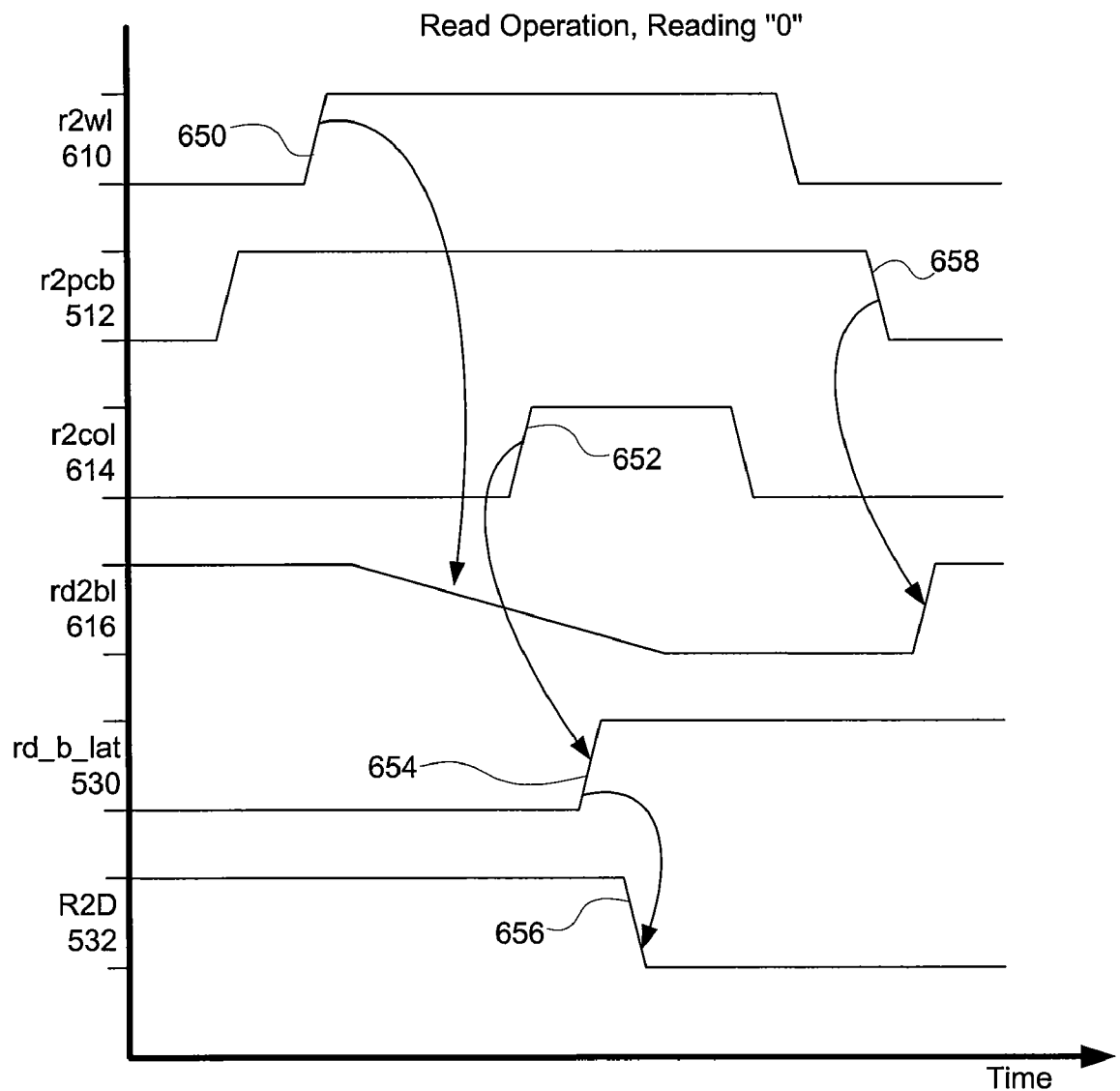
FIG. 6A illustrates a first read operation of the first read circuit, according to one embodiment of the invention.

FIG. 6A illustrates a first read operation of the first read circuit 500, according to one embodiment of the invention. In this scenario, a low (or "0") is read from the storage cell 300 of FIG. 3 and stored within the read circuit 500.

Initially, the pre-charge control signal, r2pcb 512, is low, enabling the pre-charge pull-up circuit within the read circuit 500 of FIG. 5 to pull r2bl0 510 and r2bl1 511 up to VDD 504. The behavior of r2bl0 510 and r2bl1 511 is represented by an exemplary read bit line signal, rd2bl 616. In one embodiment, read word line r2wl 610 corresponds to read word line R2WL 314 of FIG. 3. To prevent a potential conflict between the storage cell 300 and the pre-charge pull-up circuit within read circuit 500, read word line r2wl 610 should only go active (high) while r2pcb 512 is not active (high).

The pre-charge pull-up circuit is disabled in response to r2 pcb 512 transitioning to high, allowing bit line rd2bl 616 to be kept high by a pull-up P-FET (P-FET 553 pulls up r2bl0 510 and, separately, P-FET 554 pulls up r2bl1) in the bit keeper circuit. However, positive edge 650 on r2wl 610 enables storage cell 300 to pull down on read bit line rd2bl 616, discharging the voltage on rd2bl 616 to ground.

The behavior of read column select r2col 614 is representative of the read column select signals r2Col0 520 and r2Col1 524. A positive edge 652 on r2col 614 enables the column select circuit to drive the rd_b_lat 530 signal high, resulting in positive edge 654. Positive edge 654 triggers negative edge 656 on output R2D 532 and the output latch stabilizes on a low output value.

After the value stored in storage cell 300 is captured by the output latch and transmitted to R2D 532, the storage cell should be returned to a pre-charge state. As shown, falling edge 658 on r2 pcb 512 enables the pre-charge circuit, which pulls rd2bl 616 high.

Figure 6B:
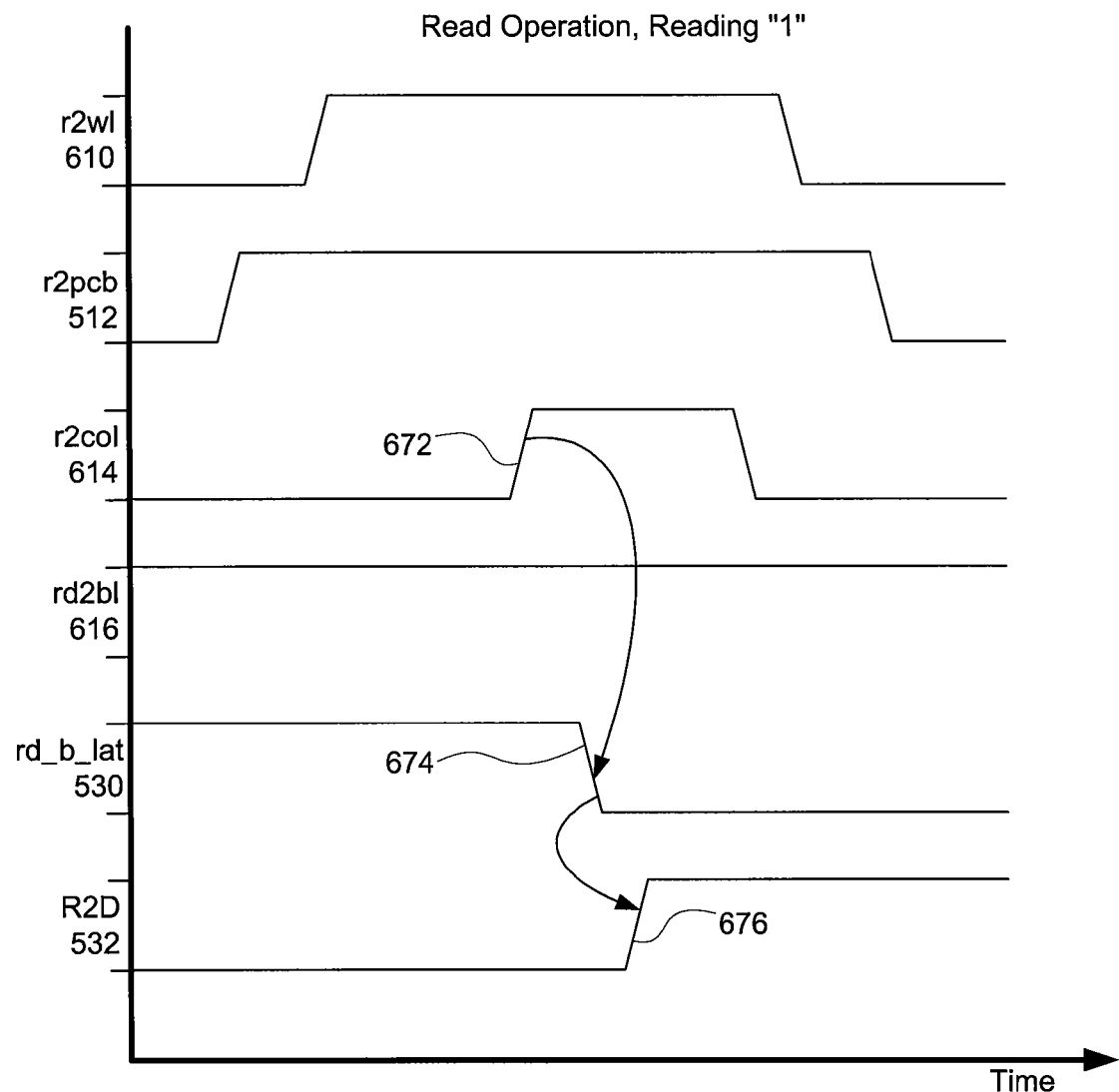
FIG. 6B illustrates a second read operation of the first read circuit, according to one embodiment of the invention.

FIG. 6B illustrates a second read operation of the first read circuit 500, according to one embodiment of the invention. In this scenario, a high (or "1") is read from the storage cell 300 of FIG. 3 and stored within the read circuit 500.

The process of reading a "1" value from storage cell 300 follows the process shown in FIG. 6A for reading a "0" value. However, in this scenario (reading a "1") positive edge 672 on r2col 614 triggers a negative edge 674 on rd_b_lat 530. Negative edge 674 then triggers positive edge 676 in R2D 532. After r2col 614 returns to a low state, the first read circuit 500 has read and latched a high value from storage cell 300.

Figure 7:
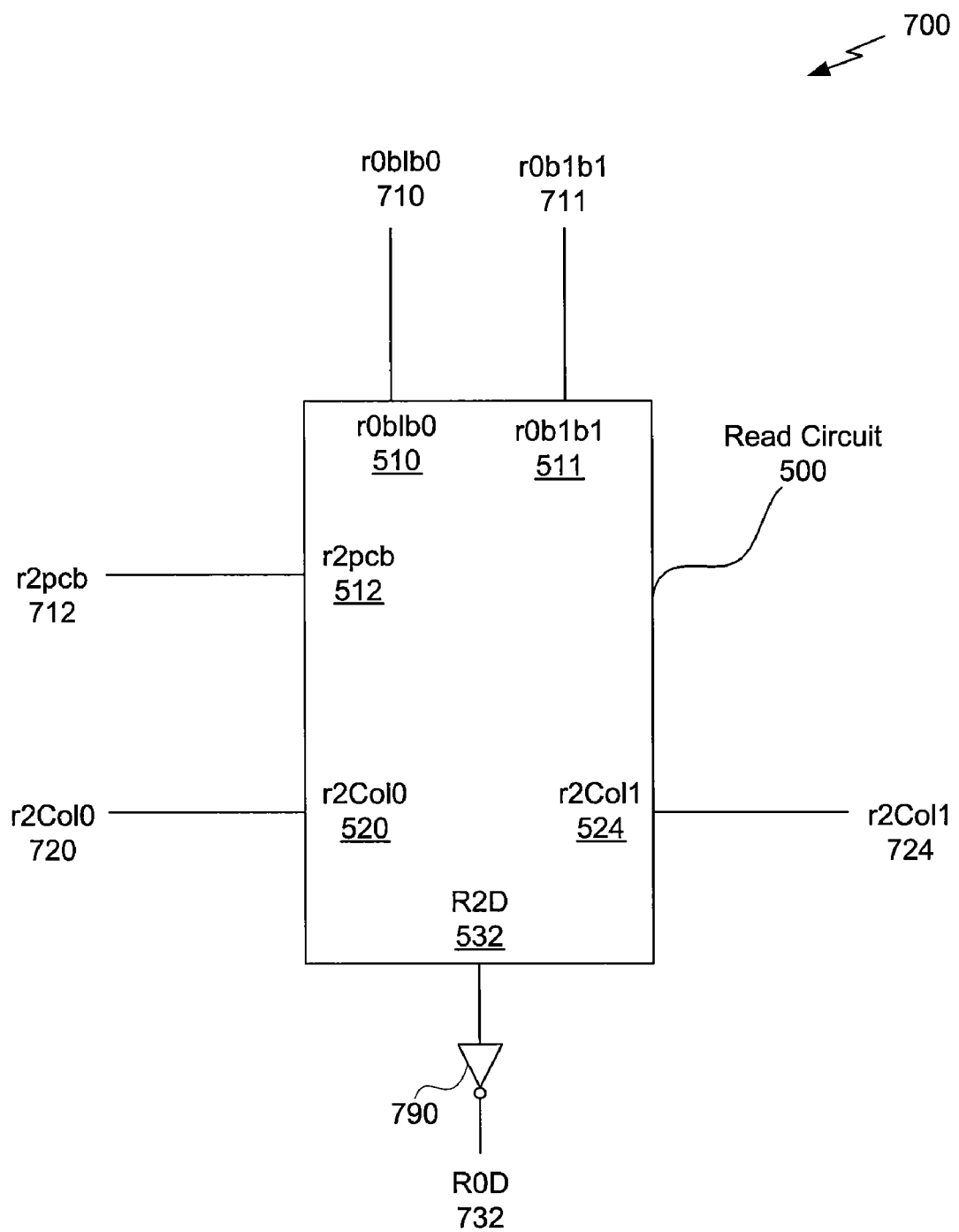
FIG. 7 illustrates a second read circuit, according to one embodiment of the invention.

FIG. 7 illustrates a second read circuit 700, according to one embodiment of the invention. The second read circuit 700 may be used to read bit lines R0BLB 322 and R1BLB 324 of the storage cell 300 of FIG. 3. In one embodiment two instances of the storage cell 300 are coupled to two instances of the second read circuit 700. The R0BLB 322 signals within the first and second instances of the storage cell 300 connect to inputs r0bl0 710 and r0blb1 711 within the first instance of read circuit 700, respectively. Similarly, the R1BLB 324 signals within the first and second instances of the storage cell 300 connect to inputs r0bl0 710 and r0blb1 711 within the second instance of read circuit 700, respectively.

The second read circuit includes an instance of the first read circuit 500 and inverter 790, which inverts data output R2D 532 to generate data output R0D 732.

Figure 8:
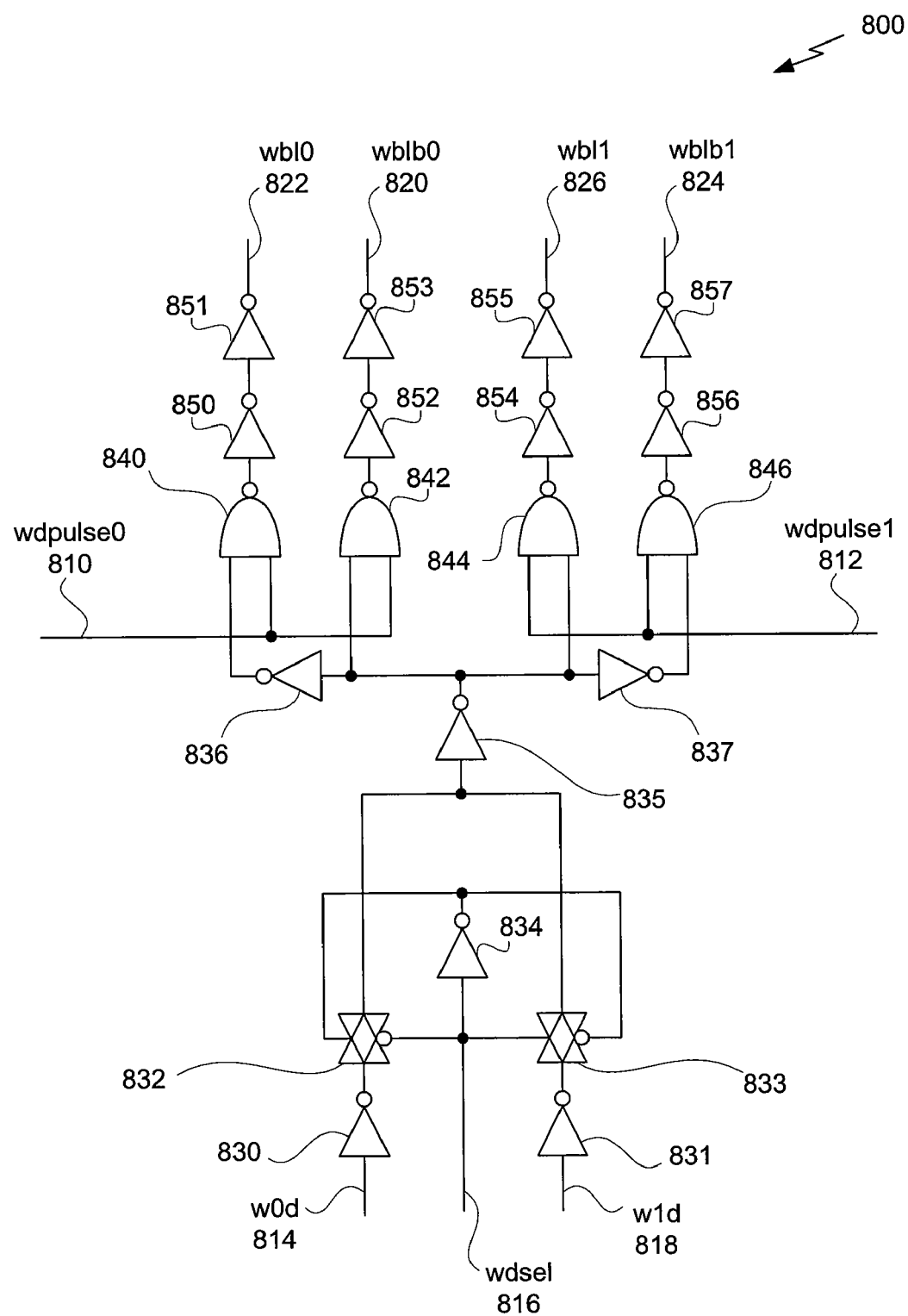
FIG. 8 illustrates a write circuit, according to one embodiment of the invention.

FIG. 8 illustrates a write circuit 800, according to one embodiment of the invention. The write circuit 800 includes two write data inputs w0d 814 and w1d 818, and a write data select input wdsel 816. The write circuit 800 also includes two pairs of differential write data bit lines. A first write data pulse input wdpulse0 810 is used to enable driving the first pair of differential write data bit lines, wblb0 820 (inverted data) and wbl0 822 (non-inverted data). A second write data pulse input wdpulse1 812 is used to enable driving the second pair of differential write data bit lines, wblb1 824 (inverted data) and wbl1 826 (non-inverted data).

Input data w0d 814 is inverted by inverter 830 and passes through pass gate 832 when wdsel 816 is low. Input data w1d 818 is inverted by inverter 831 and passes through pass gate 833 when wdsel 816 is high. Inverter 834 generates an inverted pass gate control signal required by pass gates 832 and 833. Inverters 832, 831 and 834, along with pass gates 832 and 833 form an input selector circuit. The output of the input selector circuit is inverted by inverter 835, which passes the resulting (twice inverted) data to inverters 836 and 837, as well as NAND gates 842 and 844.

When wdpulse0 810 is in a low state, NAND gates 840 and 842 both generate high outputs, which are buffered by inverters 850, 851, 852 and 853 to drive both wblb0 820 and wbl0 822 to high states. When wdpulse0 810 is in a high state, NAND gates 840 and 842 generate non-inverted and inverted representations of an original data input value, respectively. The original data input value is either the value present on w0d 814 or the value present on w1d 818, as determined by wdsel 816. The NAND gate 840, 842 outputs are buffered by inverters 850, 851, 852 and 853 to generate non-inverted data on wbl0 822 and inverted data wblb0 820.

When wdpulse1 812 is in a low state, NAND gates 844 and 846 both generate high outputs, which are buffered by inverters 854, 855, 856 and 857 to drive both wblb1 824 and wbl1 826 to high states. When wdpulse1 812 is in a high state, NAND gates 846 and 844 generate non-inverted and inverted representations of an original data input value, respectively. The original data input value is either the value present on w0d 814 or the value present on w1d 818, as determined by wdsel 816. The NAND gate 844, 846 outputs are buffered by inverters 854, 855, 856 and 857 to generate non-inverted data on wbl1 826 and inverted data wblb4 824.

Figure 9:
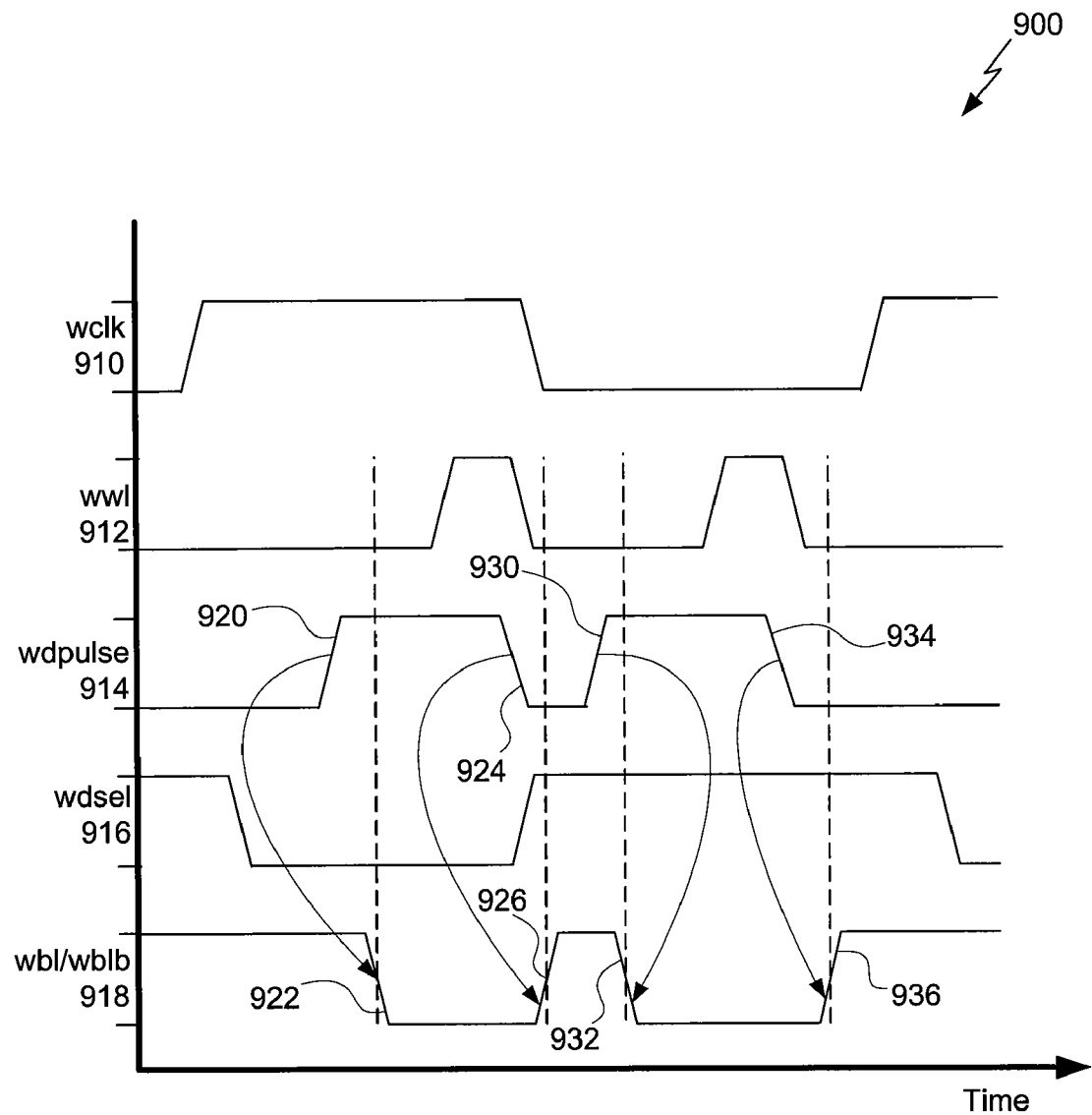
FIG. 9 illustrates the operation of the write circuit using signal waveforms, according to one embodiment of the invention.

FIG. 9 illustrates the operation of the write circuit 800 using signal waveforms 900, according to one embodiment of the invention. A system clock, wclk 910, directs the operation of the write circuit 800 to write two data values per clock cycle. The write data ports 186 and 188 of FIG. 1 each provide one data value per clock cycle to the write circuit 800. A write word line, wwl 912, illustrates the combined timing of two pulses, each corresponding to one of two independent pulses within write word lines 160. The two independent pulses are decoded from two write addresses 140, 144.

The control signal wdpulse 914 illustrates the combined timing of two write data pulses, corresponding to the write data pulses on wdpulse0 810 and wdpulse1 812. A rising edge 920 triggers a transition 922 in write bit lines wbl/wblb 918, which represent either pair of write bit lines 820 and 822 or 824 and 826. Falling edge 924 triggers transition 926 in bit lines wbl/wblb 918. At this point, a first data value, selected by wdsel 916, is written to storage cell 300 of FIG. 3. In one embodiment wdsel 916 corresponds to wdsel 816.

The second data value is written in the second half of the clock cycle illustrated in wclk 910. Rising edge 930 on wdpulse triggers wbl/wblb 918 to drive the second data value, as shown by transition 932. Falling edge 934 on wdpulse 914 triggers rising edge 936, which corresponds to write circuit 800 returning the write bit lines to a known state. Importantly, data on wbl/wblb 918 is selected by wdsel 916 and stable before the pulses on wwl 912 cause data on the bit lines to be written to the storage cell 300.

Figure 10:
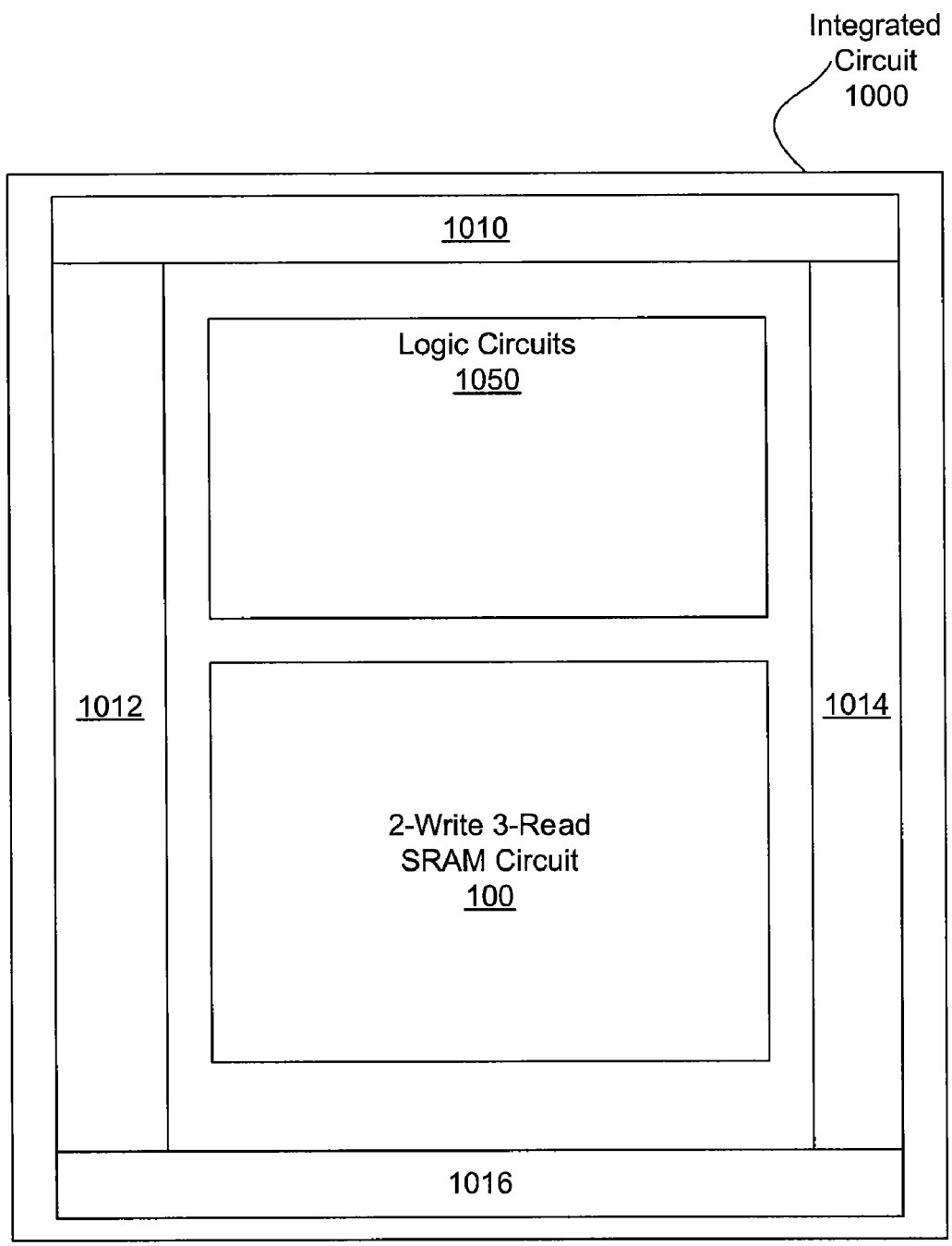
FIG. 10 depicts an integrated circuit, in which one or more aspects of the invention may be implemented.

FIG. 10 depicts an integrated circuit 100, in which one or more aspects of the invention may be implemented. Integrated circuit 1000 includes input/output circuits 1010, 1012, 714 and 1016, logic circuits 1050, and 2-write 3-read SRAM circuit 100. The input/output circuits 1010, 1012, 1014 and 1016 transmit signals on and off chip. Logic circuits 1050 compute logic equations and store certain results. The 2-write 3-read SRAM 100 is coupled to logic circuits 1050 and is configured to store and retrieve data in response to the operation of the logic circuits 1050.

In sum, a twelve transistor (12-T) static random access memory (SRAM) storage cell that provides two write ports (2-write) and three read ports (3-read). The write word line operates at twice the clock frequency. A double-pump write decoder drives the write word lines. The write bit lines are differential to provide high-performance writes.

A conventional read word line decoder generates three read word lines and operates at the clock frequency. Single-ended read bit lines are used to provide read performance comparable to the double-pumped write performance. The resulting storage cell only requires four horizontal word lines and five vertical bit lines, enabling very dense, yet high-performance designs.

While the forgoing is directed to embodiments of the present invention, other and further embodiments of the invention may be devised without departing from the basic scope thereof. For example, aspects of the present invention may be implemented in complementary symmetry metal-oxide semiconductor (CMOS) fabrication technology or other related fabrication technologies. Therefore, the scope of the present invention is determined by the claims that follow.

We claim:

1. A static random access memory (SRAM) storage cell, comprising:
    a first inverter and a second inverter configured to provide a cross-coupled latch;
    a first N-channel field-effect transistor (NFET) and a second NFET, each of which being configured to provide write access to the cross-coupled latch twice during a clock cycle;
    a third NFET and a fourth NFET configured to provide an inverted single-ended read access to the cross-coupled latch; and
    a fifth NFET and a sixth NFET configured to provide a non-inverted single-ended read access to the cross-coupled latch.

2. The SRAM storage cell of claim 1, further comprising a seventh NFET and an eighth NFET configured to provide an inverted single-ended access to the cross-coupled latch.

3. The SRAM storage cell of claim 2, further comprising a first word line coupled to the first NFET and the second NFET and configured to write data values to the cross-coupled latch.

4. The SRAM storage cell of claim 3, wherein the first word line is configured to transmit two write pulses to the cross-coupled latch per clock cycle.

5. The SRAM storage cell of claim 4, further comprising a second word line coupled to the third NFET and configured to read inverted data values from the cross-coupled latch.

6. The SRAM storage cell of claim 5, further comprising a third word line coupled to the fifth NFET and configured to read non-inverted data values from the cross-coupled latch.

7. The SRAM storage cell of claim 6, further comprising a fourth word line coupled to the eighth NFET and configured to read inverted data values from the cross-coupled latch.

8. The SRAM storage cell of claim 7, wherein the second word line is configured to transmit a read pulse with an extended active time to the third NFET, the third word line is configured to transmit a read pulse with an extended active time to the fifth NFET, and the fourth word line is configured to transmit a read pulse with an extended active time to the eighth NFET.

9. The SRAM storage cell of claim 8, further comprising a first bit line and a second bit line configured to transmit write data to the cross-coupled latch.

10. The SRAM storage cell of claim 9, wherein a write circuit provides the write data to the first bit line and the second bit line.

11. The SRAM storage cell of claim 10, further comprising a third bit line configured to transmit inverted read data from the cross-coupled latch to a first instance of a first read circuit, and a fourth bit line configured to transmit inverted read data from the cross-coupled latch to a second instance of the first read circuit.

12. The SRAM storage cell of claim 11, wherein the first instance of the first read circuit includes a first bit line for receiving inverted read data from the third bit line of the SRAM storage cell, and a second bit line for receiving inverted read data from a third bit line of another instance of the SRAM storage cell.

13. The SRAM storage cell of claim 12, wherein the first instance of the first read circuit is configured to latch inverted read data on the first bit line when a first control input has a high value.

14. The SRAM storage cell of claim 13, wherein the first instance of the first read circuit is configured to latch inverted read data on the second bit line when a second control input has a high value.

15. The SRAM storage cell of claim 14, further comprising a fifth bit line configured to transmit non-inverted read data from the cross-coupled latch to a second read circuit.

16. The SRAM storage cell of claim 15, wherein the second read circuit includes a first bit line for receiving non-inverted read data from the fifth bit line of the SRAM storage cell, and a second bit line for receiving non-inverted read data from a fifth bit line of a second instance of the SRAM storage cell.

17. The SRAM storage cell of claim 16, wherein the second read circuit is configured to capture the non-inverted read data on the first bit line when a first control input has a high value.

18. The SRAM storage cell of claim 17, wherein the second read circuit is configured to capture the non-inverted read data on the second bit line when a second control input has a high value.

19. The SRAM storage cell of claim 18, wherein the SRAM storage cell and the second instance of the SRAM storage cell reside within a storage cell array, and the first instance of the first read circuit, the second instance on of the first read circuit and the second read circuit reside in read and write circuitry coupled to the storage cell array.

20. The SRAM storage cell of claim 19, wherein the storage cell array is further coupled to decoder circuitry, and the read and write circuitry and the decoder circuitry are coupled to control circuitry.

21. The SRAM storage cell of claim 20, wherein the decoder circuitry operates in response to a clock signal and drives the first word line at twice the frequency of the clock signal.

* * * * *